(12) United States Patent
Lee et al.

(10) Patent No.: US 8,017,245 B2
(45) Date of Patent: Sep. 13, 2011

(54) COMPOSITION FOR PREPARING ORGANIC INSULATOR

(75) Inventors: Sang Yoon Lee, Seoul (KR); Jong Jin Park, Gyeonggi-Do (KR); Yi Yeol Lyu, Daejeon-Si (KR); Bon Won Koo, Gyeonggi-Do (KR); Young Hun Byun, Daejeon-Si (KR); Eun Mi Seo, Gyeonggi-Do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 260 days.

(21) Appl. No.: 11/128,309

(22) Filed: May 13, 2005

(65) Prior Publication Data

US 2005/0259212 A1 Nov. 24, 2005

Related U.S. Application Data

(63) Continuation-in-part of application No. 10/807,271, filed on Mar. 24, 2004, now abandoned.

(30) Foreign Application Priority Data

Oct. 15, 2003 (KR) .................. 10-2003-0071775

(51) Int. Cl.
*H01L 23/29* (2006.01)
(52) U.S. Cl. ......... 428/447; 257/791; 257/792; 257/793
(58) Field of Classification Search .......... 428/447; 257/791, 792, 793
See application file for complete search history.

(56) References Cited

U.S. PATENT DOCUMENTS

| | | | |
|---|---|---|---|
| 4,396,650 A | 8/1983 | Lange et al. | |
| 5,275,645 A * | 1/1994 | Ternoir et al. | 106/2 |
| 5,347,114 A | 9/1994 | Tanaka | |
| 5,981,970 A | 11/1999 | Dimitrakopoulos et al. | |
| 6,000,339 A * | 12/1999 | Matsuzawa | 106/287.14 |
| 6,232,157 B1 | 5/2001 | Dodabalapur et al. | |
| 6,291,697 B1 * | 9/2001 | Tanaka et al. | 556/457 |
| 6,440,569 B1 * | 8/2002 | Kanamori et al. | 428/429 |
| 6,448,331 B1 * | 9/2002 | Ioka et al. | 524/859 |
| 6,451,382 B2 * | 9/2002 | Schutt et al. | 427/387 |
| 6,451,436 B1 * | 9/2002 | Komatsu et al. | 428/447 |
| 6,586,791 B1 | 7/2003 | Lee et al. | |
| 6,787,191 B2 * | 9/2004 | Hanahata et al. | 427/387 |
| 7,354,650 B2 * | 4/2008 | Nakajima et al. | 428/446 |

FOREIGN PATENT DOCUMENTS

| | | |
|---|---|---|
| EP | 0 612 103 A2 | 8/1994 |
| EP | 0 997 497 A1 | 5/2000 |
| EP | 0997497 A1 | 5/2000 |
| JP | 04-050262 | 2/1992 |
| JP | 07-331172 | 12/1995 |
| JP | 07-331178 | 12/1995 |
| JP | 2000-039713 | 2/2000 |

OTHER PUBLICATIONS

Y.Y. Lin et al., "High-Mobility Pentacene Organic Thin Film Transistors", 54th Annual Device Research Conference Digest, 1996, pp. 80-81.

C.D. Dimitrakopoulos et al., "Low-Voltage Organic Transistors on Plastic Comprising High-Dielectric Constant Gate Insulators", Science, vol. 283, Feb. 5, 1999, pp. 822-824.

C. Bartic et al., "$Ta_2O_5$ as gate dielectric material for low-voltage organic thin-film transistors", Organic Electronics 3 (2002), pp. 65-72.

* cited by examiner

*Primary Examiner* — Margaret G Moore
(74) *Attorney, Agent, or Firm* — Harness, Dickey & Pierce, P.L.C.

(57) ABSTRACT

A composition for preparing an organic insulator, the composition comprising (i) at least one organic-inorganic hybrid material; (ii) at least one organometallic compound and/or organic polymer; and (iii) at least one solvent for dissolving the above two components, so that an organic insulator using the same has a low threshold voltage and driving voltage, and high charge carrier mobility and $I_{on}/I_{off}$ ratio, thereby enhancing insulator characteristics. Further, the preparation of organic insulating film can be carried out by wet process, so that simplification of the process and cut of cost are achieved.

5 Claims, 2 Drawing Sheets

COMPOSITION FOR PREPARING ORGANIC INSULATOR

The present application is a Continuation-in-Part of U.S. patent application Ser. No. 10/807,271 filed on Mar. 24, 2004 (now abandoned), which claims priority under 35 U.S.C. §119(a) to Korean Patent Application No. 2003-71775 filed on Oct. 15, 2003, the entire contents of both are herein incorporated by reference.

BACKGROUND OF THE INVENTION

1. Field of The Invention

The present invention relates, in general, to a composition for preparing an organic insulator. More specifically, the present invention relates to a composition for preparing an organic insulator comprising (i) an organic-inorganic hybrid material, (ii) at least one organometallic compound and/or organic polymer and (iii) a solvent for dissolving components (i) and (ii), and an organic insulator prepared using the same.

2. Description of The Related Art

Thin film transistors (hereinafter, referred to as 'TFT's) are frequently used in display devices and consist of a silicon semiconductor film, oxidized silicon insulating film and metal electrodes. Recently, organic TFTs employing semiconducting materials have been developed (U.S. Pat. No. 5,347,114). Such materials have been researched throughout the world due to their promising properties. Specifically, that organic TFTs are flexible and convenient to manufacture accelerate their applications in the area of field display.

Ever since the development of polyacetylene, a conjugated organic polymer that exhibits semiconductor characteristics, there has been vigorous research on organic, polymeric semiconductor materials. Such materials served as the basis for novel electronic devices with many applications in a variety of fields, for example, functional electronic devices and optical devices. This is because organic polymers, when used in an organic semiconductor, show many advantages: they can be synthesized at low cost using a variety of synthetic routes; they can be easily produced into a fiber or film; and, they show excellent flexibility and good conductivity.

As one of many devices prepared using the organic conductive polymers, organic TFTs characterized by the inclusion of an organic polymer as an active film have been studied since the 1980s. In recent years, a lot of research on such organic TFTs has been done all over the world. The organic TFT is similar in structure to a conventional Si-TFT, but it is different in that an organic polymer is used as a semiconductor material instead of silicon. In the process of making an organic TFT, a thin film of semiconductor layer can be fabricated by a printing-process under atmospheric pressure. This process is in contrast with the use of plasma, by chemical vapor deposition (CVD), which is troublesome but essential for the formation of a silicon thin film. Furthermore, for an organic TFT, a continuous roll to roll process using a plastic substrate can be applied so it is possible to provide a transistor at a lower cost.

Generally, organic TFTs are equal or superior to amorphous silicon TFTs in charge carrier mobility, but their driving and threshold voltages are very high. Using amorphous silicon and pentacene, 0.6 cm$^2$/V-sec of charge carrier mobility is expressed (N. Jackson, 54$^{th}$ Annual Device Research Conference Digest 1996), but there are some problems in that the driving voltage is higher than 100 V and the sub-threshold voltage is 50 times of that of amorphous silicon.

There has been quite a bit of research directed to using high k insulators for the purpose of controlling driving voltage and decreasing the threshold voltage, not only in the field of silicon TFTs, but also in the field of organic TFTs (U.S. Pat. No. 5,981,970, Science, Vol. 283, p 822-824, Organic Electronics 3, 65-72). For example, ferroelectric insulating materials such as $Ba_xSr_{1-x}TiO_3$ (BST), $Ta_2O_5$, $Y_2O_3$, or $TiO_2$, and inorganic insulating materials having a dielectric ratio more than 15, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$ or $SrTiO_3$ have been reported (U.S. Pat. No. 5,946,551). The devices using these materials are coated by either deposition methods (CVD, sputtering or ALD) or sol-gel methods. It is reported that the charge carrier mobility of the devices is less than 0.6 cm$^2$/V-sec and the driving voltage is less than −5V. Still, however, there are restrictions of usage with respect to the various substrates because a high temperature (200~400° C.) is required in most of manufacturing processes. Also, it is difficult to apply printing-type processes in manufacturing the devices. At present, organic insulating films containing polyimide, BCB (benzocyclobutene), photoacryl, etc., cannot match the properties of inorganic insulators (U.S. Pat. No. 6,232,157).

Recently, many attempts have been made to use organic TFTs for various driving devices. However, to realize the practical use of organic TFTs, not only in liquid crystal displays (LCDs) but also in flexible displays containing organic electroluminescent device, a charge carrier mobility over 10 cm$^2$/V-s is required. Also, in a production process, it is desirable for the insulating film to be coated by an all-printing or all-spin method on a plastic substrate for simplicity and cost reduction. There has been a lot of research directed to organic insulators having a simplified production process and improved charge carrier mobility. The focus has been on providing an advantageous condition for the formation of the organic active layer, thus increasing the grain size of organic active layer in comparison to an inorganic insulating film. Generally, these organic insulating films shows a dielectric ratio of 3-4, which requires 30-50 V of high driving voltage and 15-20 V of high threshold voltage.

To increase dielectric ratio, there has been an attempt to disperse nanometer-sized ferro-electric ceramic particles into an insulating polymer (U.S. Pat. No. 6,586,791). But, there are some problems with that approach. The ceramic particles affect the formation of the organic active layer, and thus decrease charge carrier mobility or increase leakage current. This requires that an additional insulating film having good dielectric properties be used. In this art, therefore, one must develop an organic TFT that shows a high dielectric ratio and superior insulating properties, and that can increase the display of the semiconductor.

SUMMARY OF THE INVENTION

The present invention has been made in view of the above problems, and a feature of the present invention is to provide a composition for preparing an organic insulator that exhibits low threshold and driving voltages and high charge carrier mobility.

Another feature of the present invention is to provide a method of preparing an organic insulator using the above composition.

Still another feature of the present invention is to provide an organic insulator through the above method.

Still another feature of the invention is to provide an organic TFT prepared from the above composition.

In accordance with a feature of the present invention, there is provided a composition for preparing organic insulators comprising (i) at least one organic-inorganic hybrid material;

(ii) at least one organometallic compound and/or organic polymer; (iii) and at least one solvent for dissolving the components (i) and (ii).

In accordance with another feature of the present invention, there is provided a method of preparing an organic insulator, which comprises: coating a substrate with the above composition to form an insulating film; and curing the insulating film.

In accordance with still another feature of the present invention, there is provided an organic insulator prepared by the above method.

In accordance with still another feature of the present invention, there is provided an organic thin film transistor comprising a substrate; a gate electrode; an insulating film; an organic active layer; and source-drain electrodes, wherein the insulating film is the above organic insulator.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
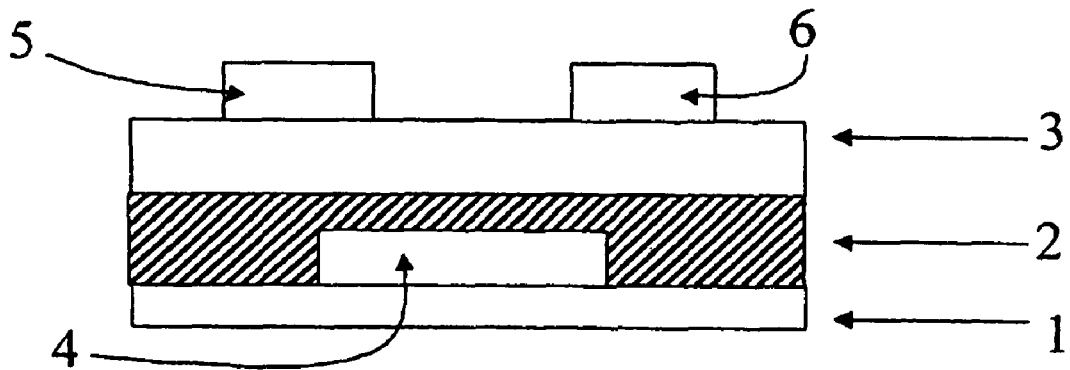
FIG. 1 is a schematic cross-sectional view of a general thin film transistor.

Hereinafter, the present invention will be described in more detail.

The composition for an organic insulator of the present invention comprises (i) at least one organic-inorganic hybrid material; (ii) at least one organometallic compound and/or organic polymer; and (iii) at least one solvent that dissolves the above two components.

In the present invention, the organic-inorganic hybrid material can be an organosilane compound or an organic-inorganic hybrid polymer formed by hydrolyzing and polycondensing an organosilane compound in the presence of an acid or alkaline catalyst. Preferably, the organic-inorganic hybrid material can be an organosilane compound represented by Formula 1, 2 or 3, or an organic-inorganic hybrid polymer formed by hydrolyzing and polycondensing an organosilane compound represented by Formula 1, 2 or 3 in an organic solvent in the presence of an acid or alkaline catalyst and water:

$$SiX^1X^2X^3X^4 \quad \text{Formula 1}$$

$$R^1SiX^1X^2X^3 \quad \text{Formula 2}$$

$$R^1R^2SiX^1X^2 \quad \text{Formula 3}$$

In the Formulas 1 to 3, $R^1$ and $R^2$ are each independently a hydrogen atom; $C_{1\sim10}$ alkyl group; $C_{3\sim10}$ cycloalkyl group; $C_{6\sim15}$ aryl group; $C_{1\sim10}$ alkyl group substituted by $C_{2\sim5}$ (meth)acryloyl group, (meth)acryloyloxy group or epoxy group; $C_{3\sim10}$ cycloalkyl group substituted by $C_{2\sim5}$ (meth)acryloyl group, (meth)acryloyloxy group or epoxy group; $C_{6\sim15}$ aryl group substituted by $C_{2\sim5}$ (meth)acryloyl group, (meth)acryloyloxy group or epoxy group; $C_{2\sim5}$ (meth)acryloyl group; $C_{2\sim5}$ (meth)acryloyloxy group; $C_{2\sim5}$ epoxy group; and $X^1$, $X^2$, $X^3$ and $X^4$ are each independently a halogen atom, or $C_{1\sim5}$ alkoxy group.

As an acid catalyst for the preparation of the organic-inorganic hybrid polymer, hydrochloric acid, nitric acid, benzene sulfonic acid, oxalic acid, formic acid, etc. are exemplified. As a base catalyst, potassium hydroxide, sodium hydroxide, triethylamine, sodium bicarbonate, pyridine, etc. are exemplified. The molar ratio of the catalyst used in hydrolyzing and polycondensing to total monomers is preferably 0.000001:1-10:1.

The molar ratio of water used in the preparation of the organic-inorganic hybrid polymer to total monomers is preferably 1:1-1000:1.

Non-limiting examples of the organic solvent used in the preparation of the organic-inorganic hybrid polymer include aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and a mixture thereof.

According to the present invention, the hydrolysis and polycondensation is preferably carried out at a temperature of 0-200° C., for 0.1-100 hrs.

Mw of the organic/inorganic hybrid polymer thus prepared is preferably in the range of 3,000-300,000.

According to the present invention, organometallic compounds refer to compounds having excellent insulating property and high dielectric ratio, including a metal oxide compound having a dielectric ratio of 4 or more. Non-limiting examples of the organometallic compounds include titanium based compounds such as titanium(IV) n-butoxide, titanium(IV) t-butoxide, titanium(IV) ethoxide, titanium(IV) 2-ethylhexoxide, titanium(IV) iso-propoxide, titanium(IV) (di-isopropoxide) bis(acetylacetonate), titanium(IV) oxide bis(acetylacetonate), trichlorotris(tetrahydrofuran)titanium (III), tris(2,2,6,6-tetramethyl-3,5-heptanedionato)titanium (III), (trimethyl) pentamethyl cyclopentadienyl titanium(IV), pentamethylcyclopentadienyltitanium trichloride(IV), pentamethylcyclo-pentadienyltitanium trimethoxide(IV), tetrachlorobis(cyclohexylmercapto) titanium(IV), tetrachlorobis(tetrahydrofuran)titanium(IV), tetrachlorodiaminetitanium (IV), tetrakis(diethylamino)titanium(IV), tetrakis(dimethylamino)titanium(IV), bis(t-butylcyclopentadienyl) titanium dichloride, bis(cyclopentadienyl) dicarbonyl titanium(II), bis(cyclopentadienyl)titanium dichloride, bis(ethylcyclopentadienyl)titanium dichloride, bis(pentamethylcyclopentadienyl)titanium dichloride, bis(iso-propylcyclopentadienyl)titanium dichloride, tris(2,2,6,6-tetramethyl-3,5-heptanedionato)oxotitanium(IV), chlorotitanium triisopropoxide, cyclopentadienyltitanium trichloride, dichlorobis(2,2,6,6-tetramethyl-3,5-heptanedionato)titanium(IV), dimethylbis(t-butylcyclopentadienyl)titanium (IV), and di(iso-propoxide)bis(2,2,6,6-tetramethyl-3,5-heptanedionato)titanium(IV); zirconium based compounds such as zirconium(IV) n-butoxide, zirconium(IV) t-butoxide, zirconium(IV) ethoxide, zirconium(IV) iso-propoxide, zirconium(IV) n-propoxide, zirconium(IV) acetylacetonate, zirconium(IV) hexafluoroacetylacetonate, zirconium(IV) trifluoroacetylacetonate, tetrakis(diethylamino)zirconium, tetrakis(dimethylamino)zirconium, tetrakis(2,2,6,6-tetramethyl-3,5-heptanedionato)zirconium(IV), and zirconium(IV) sulfate tetrahydrate; hafnium based compounds such as hafnium(IV) n-butoxide, hafnium(IV) t-butoxide, hafnium (IV) ethoxide, hafnium(IV) iso-propoxide, hafnium(IV) iso-propoxide monoisopropylate, hafnium(IV) acetylacetonate, and tetrakis(dimethylamino)hafnium; and aluminum based compounds such as aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate, and tris(2,2,6,6-tetramethyl-3,5-heptanedionato)aluminum.

The ratio of organometallic compound used in the inventive composition is preferably 1-300 parts by weight, more preferably 5-100 parts by weight, based on 100 parts by weight of the organic-inorganic hybrid material. When the ratio exceeds 300 parts by weight, excessive leakage current takes place, so that $I_{on}/I_{off}$ ratio and charge carrier mobility are deteriorated. When the ratio is lower than 1 part by weight, it is difficult to form a thin film and charge carrier mobility remarkably decreases.

The organic polymer includes most polymers exhibiting insulating properties. Non-limiting examples of the insulating organic polymer include polyesters, polycarbonates, polyvinylalcohols, polyvinylbutyrals, polyacetals, polyarylates, polyamides, polyamidimides, polyetherimides, polyphenylene ethers, polyphenylene sulfides, polyethersulfones, polyetherketones, polyphthalamides, polyethernitriles, polyethersulfones, polybenzimidazoles, polycarbodiimides, polysiloxanes, polymethylmethacrylates, polymethacrylamides, nitrile rubbers, acryl rubbers, polyethylenetetrafluorides, epoxy resins, phenol resins, melamine resins, urea resins, polybutenes, polypentenes, poly(ethylene-co-propylene), poly(ethylene-co-butenediene), polybutadienes, polyisoprenes, poly(ethylene-co-propylene diene), butyl rubbers, polymethylpentenes, polystyrenes, poly(styrene-co-butadiene), hydrogenated poly(styrene-co-butadiene), hydrogenated polyisoprenes, and hydrogenated polybutadienes.

The ratio of organic polymer used in the inventive composition is preferably 0.01-50 parts by weight, more preferably 0.1-25 parts by weight, based on 100 parts by weight of the organic-inorganic hybrid material. When the ratio exceeds 50, the properties of devices are excessively deteriorated. When the ratio is lower than 0.01 parts by weight, it is difficult to form a thin film by spin-coating.

In the present invention, electronic properties of the organic insulator, such as dielectric constant, leakage currents, etc., are controlled by changing the ratio of the organic-inorganic hybrid material, and the organometallic compounds and/or organic polymer in the composition.

Non-limiting examples of the organic solvent used in the inventive composition include aliphatic hydrocarbon solvents such as hexane; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and a mixture thereof.

The organic solvent should be used in an amount sufficient to apply the solid components, including the organic-inorganic hybrid material and organometallic compound, evenly to the surface of a substrate. In this regard, the content of the organic solvent in the composition is 20-99.9 wt %, preferably 70-95 wt %. If the organic solvent content is less than 20 wt %, part of the solid components remain undissolved. On the other hand, if the organic solvent content is more than 99.9 wt %, the final thin film is as thin as 1000 Å or less.

In the present invention, there is provided a method of preparing an organic insulator comprising coating the above composition onto a substrate and curing the coated film. Non-limiting examples of the coating method useful in the present invention include spin-coating, dip-coating, printing, spray-coating and roll-coating, while spin-coating is most preferred. The curing is carried out by heating the substrate at a temperature of 70-150° C., for 0.5-2 hrs.

An organic insulator prepared according to the above method shows superior insulating properties. When it is applied to TFF, high charge carrier mobility, low driving and threshold voltages and an excellent $I_{on}/I_{off}$ ratio are obtained. In particular, the preparation of the insulating film can be achieved by a wet process, such as printing or spin coating, while the organic TFT produced thereby can rival a TFT comprising inorganic insulating films prepared by CVD process in its performance.

In addition, the present invention provides an organic TFT comprising the above organic insulator as an insulating layer. FIG. 1 illustrates a schematic view of a general organic thin film transistor (TFT). The TFT comprises a substrate 1, an insulating film 2, an organic active film 3, a gate electrode 4, a source electrode 5 and a drain electrode 6. But the present invention can be applied to various types of TFTs and is not limited to the TFT shown in FIG. 1.

Preferably, the substrate is made of plastic, glass, silicon, etc.

In the organic TFT of the present invention, the organic active layer can be made of any material known to be an organic semiconductor, including a conducting polymer. Preferably, the organic active layer is prepared from pentacene, copper phthalocyanine, polythiophene, polyaniline, polyacetylene, polypyrrole, polyphenylene vinylene or derivatives thereof, but is not limited thereto.

The gate and source/drain electrodes are made of gold (Au), silver (Ag), aluminum (Al), nickel (Ni), indium thin oxide (ITO), but are not limited thereto.

Hereinafter, the present invention will be described in more detail with reference to the following Examples. However, these examples are provided only for illustrative purposes and are not to be construed as limiting the scope of the present invention.

Example 1

A polymer of methacryloxypropyltrimethoxysilane (hereinafter, referred to 'MAPTMS') was used as an organic-inorganic hybrid material. 80.531 mmol (20 g) of MAPTMS was introduced into a flask, and then 3.5 ml of hydrochloric acid solution in deionized water (0.001021 mol of hydrochloric acid/1 cc of water) was introduced into the flask. The mixture was reacted at room temperature for 30 min, and then 100 ml of tetrahydrofuran and 100 ml of diethylether were added to the mixture in order to quench the reaction. The reaction mixture was transferred to a separatory funnel and washed 3 times with water. After washing, volatile materials were evaporated to produce a colorless sticky liquid MAPTMS polymer under a reduced pressure. The polymer was dissolved in 15 ml of acetone, and this solution is filtered through a 0.2 μm-sized filter so as to remove minute powder and impurities. And then the liquid phase was separated, followed by removing volatile materials under a reduced pressure to provide 13 g of colorless liquid polymer.

A mixture of the MAPTMS polymer and tetrabutoxy titanate($Ti(OC_4H_9)_4$) (70:30 weight ratio), was dissolved in butanol in a concentration of 10 wt %. The solution was coated on a glass substrate by a spin coating method to form a 7000 Å thick film, which was then thermally cured at 70° C. for 1 hour and then 150° C. for 30 min, thus yielding an insulating film. Next, pentacene was deposited at a thickness of 700 Å through OMBD (organic molecular beam deposition). At this time, the deposition was conducted under the condition of a vacuum pressure of $2\times10^{-6}$ torr, a substrate temperature of 80° C. and a deposition rate of 0.3 Å/sec. Then, source-drain electrodes were formed on the pentacene active film with a shadow mask having a channel length of 100 μm and a channel width of 1 mm to obtain final organic TFT. The charge carrier mobility, threshold voltage and $I_{on}/I_{off}$ ratio of the prepared organic TFT were measured according to the following explanation and are shown in Table 1.

(1) Charge Carrier Mobility and Threshold Voltage

The charge carrier mobility of the devices was calculated by the following equation (4) from the slope of a graph representing the relationship between $(I_{SD})^{1/2}$ and $V_G$, wherein the graph was plotted according to the following current equations in saturation region (1) and (2) and the slope was calculated by the following equation (3):

$$I_{SD} = \frac{WC_o}{2L}\mu(V_G V_T)^2 \quad (1)$$

$$\sqrt{I_{SD}} = \sqrt{\frac{\mu C_o W}{2L}}(V_G - V_T) \quad (2)$$

$$slope = \sqrt{\frac{\mu C_o W}{2L}} \quad (3)$$

$$\mu_{FET} = (slope)^2 \frac{2L}{C_o W} \quad (4)$$

In the above equations (1)-(4), $I_{SD}$: source-drain current; $\mu$ or $\mu_{FET}$: charge carrier mobility; $C_o$: capacitance of the insulating layer; W: channel width; L: channel length; $V_G$: gate voltage; and $V_T$: threshold voltage.

Threshold voltage ($V_T$) was obtained from the intersection where the $V_G$ axis intersects the extension of the linear portion of the graph representing the relationship between $(I_{SD})^{1/2}$ and $V_G$. As the absolute value of the threshold voltage approximates zero, the consumption of electric power decreases.

(2) $I_{on}/I_{off}$ Ratio $I_{on}/I_{off}$ ratio can be determined from a ratio of a maximum current in the on-state to a minimum current in the off-state and it is represented by the following equation (5):

$$\frac{I_{on}}{I_{off}} = \left(\frac{\mu}{\sigma}\right)\frac{C_0^2}{qN_A t^2}V_D^2 \quad (5)$$

In the above equation (5), $I_{on}$: maximum current; $I_{off}$: off-state leakage current; $\mu$: charge carrier mobility; $\sigma$: conductivity of the active layer; q: electric charge; $N_A$: electric charge density; t: thickness of the insulating layer; $C_0$: capacitance of the insulating layer; and $V_D$: drain voltage.

As can be seen from this equation, the larger the dielectric constant and the smaller the thickness of the dielectric film, the larger the obtained $I_{on}/I_{off}$ ratio. Therefore, the kind and thickness of the dielectric film are crucial factors for determining the $I_{on}/I_{off}$ ratio.

TABLE 1

|  | MAPTMS polymer (g) | Ti(OC$_4$H$_9$)$_4$ (g) | $I_{on}/I_{off}$ ratio | Charge carrier mobility (cm$^2$/V·s) | Threshold Voltage (V) |
| --- | --- | --- | --- | --- | --- |
| Example 1 | 0.7 | 0.3 | 1000 | 15 | −4 |

As seen in Table 1, the organic TFT exhibits charge carrier mobility more than 10, which is the highest value in the known insulating materials. Also, the threshold voltage is less than −5V, resulting in low voltage driving characteristics.

Example 2

7 wt % of polyvinylbutyral (hereinafter, referred to 'PVB') solution in butanol was prepared. MAPTMS polymer and PVB solution were mixed in the ratio shown in Table 2, and the mixture was used in producing an insulating film. The method of forming an insulating film and process of fabricating an organic TFT were performed according to the same method as in Example 1. Also, the properties of the resulting organic TFT were measured according to the same method as in Example 1.

TABLE 2

|  | PVB solution (g) | MAPTMS polymer (g) | $I_{on}/I_{off}$ ratio | Charge carrier mobility (cm$^2$/V·s) | Threshold Voltage (V) |
| --- | --- | --- | --- | --- | --- |
| Example 2-1 | 0.75 | 0.25 | 300,000 | 8 | −11.45 |
| Example 2-2 | 0.5 | 0.5 | 200,000 | 8 | −8.7 |

As seen in Table 2, the organic TFT exhibits an $I_{on}/I_{off}$ ratio more than $10^5$, and a charge carrier mobility more than 8 cm$^2$/V·s, accordingly showing excellent transistor properties.

Example 3

7 wt % of PVB solution in butanol was prepared. The PVB solution, MAPTMS polymer and tetrabutyl titanate were mixed in the ratio shown in Table 3 and the mixture was spin-coated on an aluminum substrate to 2000 Å thick film which was then cured at 70° C. for 1 hr and at 150° C. for 30 minutes to provide an insulating film. To the insulating film, an aluminum film was deposited to form an M-I-M (metal-insulator-metal) capacitor structure. Using this, capacitance per unit area $C_0$ was measured at 100 kHz. From the measured dielectric ratio, dielectric constant was measured according to the following formula (6)

$$C_0 = \in\in_0(A/d) \quad (6)$$

wherein, $C_0$ is dielectric capacitance; $\in$ and $\in_0$ are respectively dielectric constant of the dielectric material and vacuum; A is area of device; and d is a thickness of the dielectric material.

TABLE 3

|  | PVB solution (g) | Ti(OC$_4$H$_9$)$_4$ (g) | MAPTMS polymer (g) | Dielectric constant κ |
| --- | --- | --- | --- | --- |
| Example 3-1 | 0.1 g | 0.25 g | 0.25 g | 5.82 |
| Example 3-2 | 0.1 g | 0.25 g | 0.75 g | 5.1 |
| Example 3-3 | 0.1 g | 0.75 g | 0.25 g | 7.1 |
| Example 3-4 | 0.1 g | 0.75 g | 0.75 g | 6.2 |

Example 4

7 wt % of PVB solution in butanol was prepared. The PVB solution, MAPTMS polymer and tetrabutyl titanate were mixed in the ratio shown in Table 4 and the mixture was used in producing an insulating film. The method of forming the insulating film and process of fabricating the organic TFT were performed according to the same method as in Example 1. Also, the properties of the resulting organic TFT were measured according to the same method as in Example 1.

TABLE 4

|  | PVB solution (g) | Ti(OC$_4$H$_9$)$_4$ (g) | MAPTMS polymer (g) | I$_{on}$/I$_{off}$ ratio | Charge carrier mobility (cm$^2$/V·s) | Threshold Voltage (V) |
|---|---|---|---|---|---|---|
| Example 4-1 | 0.1 | 0.25 | 0.25 | 395 | 8.26 | −2.2 |
| Example 4-2 | 0.1 | 0.25 | 0.75 | 67000 | 30 | −3.1 |
| Example 4-3 | 0.1 | 0.75 | 0.25 | 12 | 0.65 | −0.3117 |
| Example 4-4 | 0.1 | 0.75 | 0.75 | 1260 | 6.61 | −1 |
| Example 4-5 | 0.3 | 0.5 | 0.5 | 1990 | 4.31 | −2.3 |
| Example 4-6 | 0.5 | 0.25 | 0.25 | 2120 | 3.25 | −2.53 |
| Example 4-7 | 0.5 | 0.25 | 0.75 | 70400 | 24.5 | −5.72 |
| Example 4-8 | 0.5 | 0.75 | 0.25 | 16.2 | 1.48 | −1.37 |
| Example 4-9 | 0.5 | 0.75 | 0.75 | 1180 | 3.77 | −0.485 |

In Table 4, it can be seen that an increase of the organic titanium results in a decrease in charge carrier mobility and I$_{on}$/I$_{off}$ ratio, while threshold voltage is also decreased. In addition, it can be seen that increasing the MAPTMS polymer results in an increase of charge carrier mobility and I$_{on}$/I$_{off}$ ratio, so charge carrier mobility increases to 100 times and I$_{on}$/I$_{off}$ ratio to 10000 times.

Example 5

Figure 2:
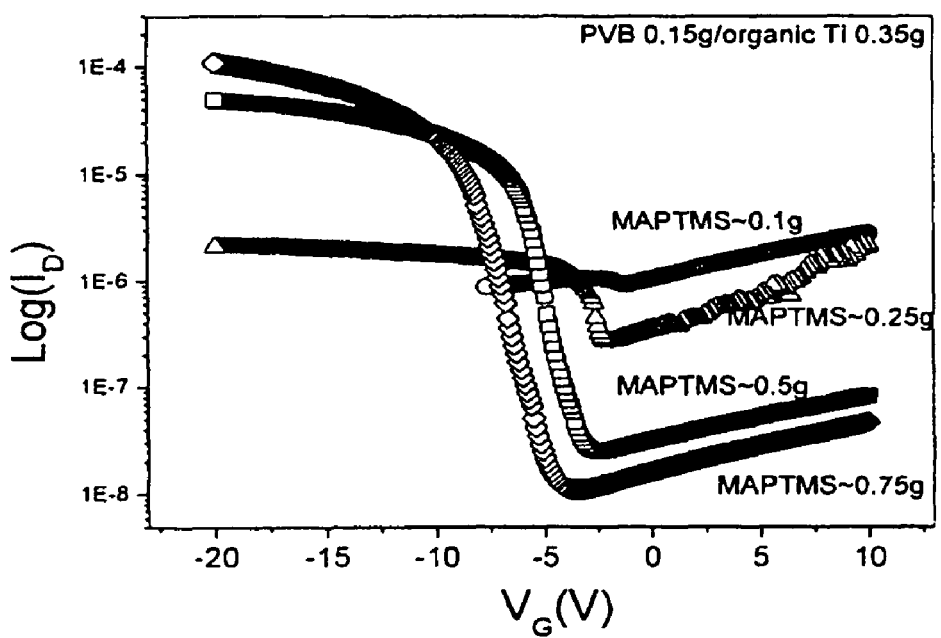
FIG. 2 illustrates a graph showing driving characteristics of an organic TFT prepared in Example 5.

To a mixture of PVB solution (7 wt %) 0.15 g and tetrabutyl titanate 0.35 g, respectively 0.1 g, 0.25 g, 0.5 g and 0.75 g of MAPTMS polymer were mixed and the mixtures were used in producing insulating films. The method of forming the insulating films and process of fabricating organic TFTs were performed according to the same method as in Example 1. The driving characteristics of the resulting TFTs are shown in FIG. 2. In FIG. 2, as the amount of organic-inorganic hybrid material increases, leakage current decreased and on-current and charge carrier mobility increased. Threshold voltage was below −5V, which is a lower level than the conventional organic insulator.

Example 6

MAPTMS polymer, epoxy resin and tetrabutyl titanate were mixed in the ratio shown in Table 5 and butanol was added thereto to produce a solution. The solution was coated on a substrate by spin-coating according to the same manner as in Example 1 to produce an insulating film, which was then cured under the conditions shown in Table 5. Manufacturing an organic TFT was performed according to the same manner as in Example 1, and the properties of the organic TFT were measured according to the same manner as in Example 1.

TABLE 5

|  | Epoxy Resin (g) | Ti(OC$_4$H$_9$)$_4$ (g) | MAPTMS polymer (g) | Curing Condition | κ | I$_{on}$/I$_{off}$ ratio | Charge carrier mobility (cm$^2$/V·s) | Threshold Voltage (V) |
|---|---|---|---|---|---|---|---|---|
| Example 6-1 | 0.05 | 0.45 | 0.25 | Heat curing (150° C.) | 5.75 | 100 | 0.2 | −5 |
| Example 6-2 | 0.05 | 0.45 | 0.5 | Heat curing (150° C.) | 5.53 | 1000 | 6 | −3 |
| Example 6-3 | 0.05 | 0.45 | 0.75 | Heat curing (150° C.) | 5.76 | 9600 | 25 | −4.2 |
| Example 6-4 | 0.05 | 0.45 | 0.25 | UV curing (600 W, 10 min) | 5.9 | 31 | 0.1 | 0.1 |
| Example 6-5 | 0.05 | 0.45 | 0.5 | UV curing (600 W, 10 min) | 5.57 | 121000 | 30 | −6.5 |
| Example 6-6 | 0.05 | 0.45 | 0.75 | UV curing (600 W, 10 min) | 5.65 | 720000 | 47 | −9 |

In Table 5, it can be seen that the use of the epoxy resin results in similar driving properties as when PVB was used. And it is noted that the electrical properties are changed according to not only the amount of organic-inorganic hybrid material used but also the curing method. In the case of Example 6-6, the device shows high values in charge carrier mobility as well as I$_{on}$/I$_{off}$ ratio.

Example 7

Figure 3:
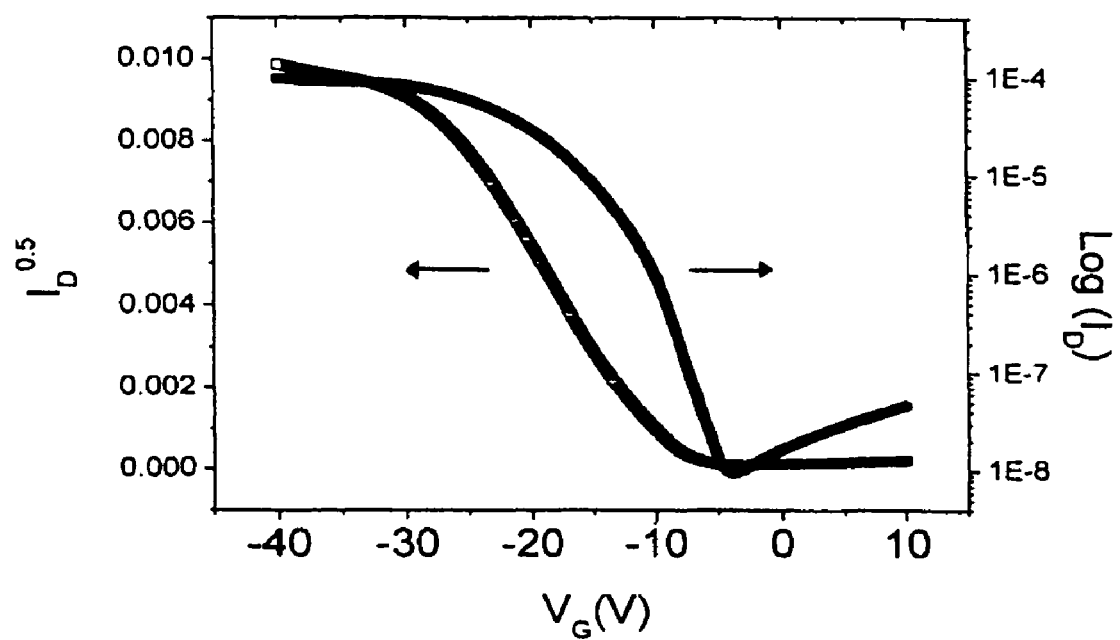
FIG. 3 illustrates a graph showing driving characteristics of an organic TFT prepared in Example 7.

To a mixture of PVB solution (7 wt %) 0.15 g and tetrabutyl titanate 0.35 g, MAPTMS 0.75 was added, and the mixture was dissolved in butanol to provide a 10 wt % solution. The solution was spin-coated according to the same method as in Example 1. Fabrication of an organic TFT was carried out according to the same manner as in Example 1, and the properties of the resultant organic TFT were measured according to the same manner as in Example. From FIG. 3, I$_{on}$/I$_{off}$ ratio was calculated to be about 10$^4$ and the charge carrier mobility to be about 3~5 cm$^2$ V·s. The I$_{on}$/I$_{off}$ ratio and the charge carrier mobility lowered to some degree in this case, but it is noted that the prepared organic TFT has excellent properties compared to existing organic insulator.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor, comprising:
a substrate; a gate electrode; an insulating film; an organic active layer; and source-drain electrodes,
wherein the insulating film is prepared from a composition including,
(i) at least one organic-inorganic hybrid polymer that is a hydrolyzate and polycondensate of an organosilane compound represented by Formula (2) formed in the presence of an acid or alkaline catalyst:

$$R^1SiX^1X^2X^3 \quad \text{Formula (2)}$$

wherein $R^1$ is $C_{1-10}$ alkyl group substituted by $C_{2-5}$ (meth)acryloyl group, (meth)acryloyloxy group or epoxy group; $C_{3-10}$ cycloalkyl group substituted by $C_{2-5}$ (meth)acryloyl group, (meth)acryloyloxy group or epoxy group; $C_{6-15}$ aryl group substituted by $C_{2-5}$(meth)acryloyl group, (meth)acryloyloxy group or epoxy group; $C_{2-5}$ (meth)acryloyl group; $C_{2-5}$ (meth)acryloyloxy group; or $C_{2-5}$ epoxy group; and
$X^1, X^2, X^3$ are each independently a $C_{1-5}$ alkoxy group;
(ii) at least one organometallic compound and at least one organic polymer, wherein the at least one organometallic compound is selected from a group consisting of titanium(IV) n-butoxide, titanium(IV) t-butoxide, titanium (IV) ethoxide, titanium(IV) 2-ethylhexoxide, titanium (IV) iso-propoxide, titanium(IV) (di-iso-propoxide) bis (acetylacetonate), titanium(IV) oxide bis acetylacetonate), trichlorotris(tetrahydrofuran)titanium (III), tris(2,2,6,6-tetramethyl-3,5-heptanedionato)titanium(III), (trimethyl) pentamethyl cyclopentadienyl titanium(IV), pentamethylcyclopentadienyltitanium trichloride (IV), pentamethylcyclo-pentadienyltitanium trimethoxide (IV), tetrachlorobis (cyclohexylmercapto) titanium(IV), tetrachlorobis(tetrahydrofuran)titanium (IV), tetrachlorodiaminetitanium(IV), tetrakis(diethylamino)titanium(IV), tetrakis(dimethylamino)titanium (IV), bis(t-butylcyclopentadienyl)titanium dichloride, bis(cyclopentadienyl) dicarbonyl titanium bis(cyclopentadienyl)titanium dichloride, bis(ethylcyclopentadienyl)titanium dichloride, bis(pentamethylcyclopentadienyl)titanium dichloride, bis(isopropylcyclopentadienyl)titanium dichloride, tris (2,2,6,6-tetramethyl-3,5-heptanedionato)oxotitanium(IV), chlorotitanium triisopropoxide, cyclopentadienyltitanium trichloride, dichlorobis(2,2,6,6-tetramethyl-3,5-heptanedionato)titanium(IV), dimethylbis(t-butylcyclopentadienyl)titanium(IV), di(iso-propoxide)bis(2,2,6,6-tetramethyl-3,5-heptanedionato) titanium(IV), zirconium(IV) n-butoxide, zirconium(IV) t-butoxide, zirconium(IV) ethoxide, zirconium(IV) iso-propoxide, zirconium(IV) n-propoxide, zirconium(IV) acetylacetonate, zirconium(IV) hexafluoroacetylacetonate, zirconium(IV) trifluoroacetylacetonate, tetrakis(diethylamino)zirconium, tetrakis(dimethylamino)zirconium, tetrakis(2,2,6,6-tetramethyl-3,5-heptanedionato)zirconium(IV), zirconium(IV) sulfate tetrahydrate, hafnium (IV) n-butoxide, hafnium(IV) t-butoxide, hafnium(IV) ethoxide, hafnium(IV) iso-propoxide, hafnium(IV) iso-propoxide monoisopropylate, hafnium(IV) acetylacetonate, tetrakis(dimethylamino)hafnium, aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate and tris(2,2,6,6-tetramethyl-3,5-heptanedionato) aluminum; and
(iii) at least one solvent for dissolving the components (i) and (ii),
wherein a ratio of the at least one organometallic compound is 100 parts by weight to 300 parts by weight based on 100 parts by weight of the at least one organic-inorganic hybrid polymer.

2. The organic thin film transistor according to claim 1, wherein the organic polymer is selected from a group consisting of polyesters, polycarbonates, polyvinylalcohols, polyvinylbutyrals, polyacetals, polyarylates, polyamides, polyamidimides, polyetherimides, polyphenylenethers, polyphenylenesulfides, polyethersulfones, polyetherketones, polyphthalamides, polyethernitriles, polyethersulfones, polybenzimidazoles, polycarbodiimides, polysiloxanes, polymethylmethacrylates, polymethacrylamides, nitrite rubbers, acryl rubbers, polyethylenetetrafluorides, epoxy resins, phenol resins, melamine resins, urea resins, polybutenes, polypentenes, poly(ethylene-co-propylene), poly(ethylene-co-butenediene), polybutadienes, polyisoprenes, poly(ethylene-co-propylene diene), butyl rubbers, polymethylpentenes, polystyrenes, poly(styrene-co-butadiene), hydrogenated poly(styrene-co-butadiene), hydrogenated polyisoprenes, and hydrogenated polybutadienes.

3. The organic thin film transistor according to claim 1, wherein the ratio of the organic polymer is 0.01-50 parts by weight based on 100 parts by weight parts of the organic-inorganic hybrid material.

4. The organic thin film transistor according to claim 1, wherein the solvent is selected from a group consisting of aliphatic hydrocarbon; aromatic hydrocarbon solvents; ketone-based solvents; ether-based solvents; acetate-based solvents; alcohol-based solvents; amide-based solvents; silicon-based solvents; and a mixture thereof.

5. The organic thin film transistor according to claim 1, wherein the content of the organic solvent in the composition is 20-99.9 wt %.

* * * * *